(12) United States Patent
Delattre

(10) Patent No.: US 7,396,483 B2
(45) Date of Patent: Jul. 8, 2008

(54) UNIFORM CHEMICAL ETCHING METHOD

(75) Inventor: Cécile Delattre, Saint Hilaire du Touvet (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 0 days.

(21) Appl. No.: 11/214,589

(22) Filed: Aug. 29, 2005

(65) Prior Publication Data

US 2006/0261042 A1   Nov. 23, 2006

(30) Foreign Application Priority Data

May 19, 2005   (FR) .................................. 05 05015

(51) Int. Cl.
*H01L 21/302* (2006.01)
*B44C 1/22* (2006.01)

(52) U.S. Cl. ........................... 216/92; 216/99; 438/748; 438/752; 438/753

(58) Field of Classification Search ............ 156/345.11, 156/345.15, 345.22; 216/92, 99; 438/748, 438/752, 753

See application file for complete search history.

(56) References Cited

U.S. PATENT DOCUMENTS

| | | | | |
|---|---|---|---|---|
| 6,689,211 B1 * | 2/2004 | Wu et al. | ...................... | 117/94 |
| 6,953,736 B2 * | 10/2005 | Ghyselen et al. | ............ | 438/458 |
| 7,018,910 B2 * | 3/2006 | Ghyselen et al. | ............ | 438/458 |
| 2002/0026985 A1 | 3/2002 | Kai | ............................. | 156/345 |
| 2004/0053477 A1 | 3/2004 | Ghyselen et al. | ............ | 438/465 |

FOREIGN PATENT DOCUMENTS

| | | | |
|---|---|---|---|
| JP | 07-245287 | * | 9/1995 |
| JP | 08-035078 | * | 2/1996 |
| JP | 08-279485 | * | 10/1996 |
| JP | 11-274259 | * | 10/1999 |
| JP | 2001-135611 | * | 5/2001 |
| JP | 2002-336761 | * | 11/2002 |
| JP | 2003 318154 | | 11/2003 |
| WO | WO 2004/006311 | | 1/2004 |

* cited by examiner

*Primary Examiner*—George A. Goudreau
(74) *Attorney, Agent, or Firm*—Winston & Strawn LLP

(57) ABSTRACT

The invention concerns a method of wet chemical etching of a wafer comprising at least one surface layer of silicon-germanium (SiGe) for etching by dispensing an etching solution deposited on a rotating wafer, the method being characterized in that it comprises a first etching step in which said etching solution is dispensed from a fixed position located at a predetermined distance from the center of the wafer, and a second etching step in which the etching solution is dispensed radially from the center of the wafer and over a maximum distance which is less than the radius of said wafer.

15 Claims, 3 Drawing Sheets

UNIFORM CHEMICAL ETCHING METHOD

FIELD OF THE INVENTION

The present invention relates to selective chemical etching of surface layers of wafers, in particular that carried out during the fabrication of sSOI (strained silicon on insulator) or SGOI (silicon-germanium (SiGe) on insulator) type wafers.

BACKGROUND

A number of techniques exist for preparing such wafers. One example of one of the most effective current techniques for fabricating sSOI or SGOI type wafers is the production of an active layer of strained silicon (sSi) or relaxed SiGe by transfer thereof to an insulating support (for example a layer of $SiO_2$ on a silicon substrate) using the Smart Cut® technique, to produce the desired heterostructure. Particular examples of implementations of such fabrication techniques are described in United States patent application US 2004/053477 and International patent application WO 2004/006311.

The finishing step of said wafers involves a selective etching and optional chemical-mechanical polishing procedure to eliminate the layer or layers subsisting above the silicon layer after transfer thereof to the "receiver" substrate and detachment from the "donor" substrate.

The term "selective etching" as used here means a chemical attack method which can selectively eliminate the upper layer of a given material (a layer of SiGe, for example) without attacking the next layer (strained silicon, for example), consequently termed a stop layer, by adjusting the composition of the chemical solution.

Because of the thinness of the active strained silicon layer (of the order of 200 angstroms (Å)), it is important to be able to control with great accuracy the thickness of said layer and the final surface quality. Such a requirement in the present case necessitates optimizing the selective etching procedure which is normally used.

For the usual method termed the "single wafer" method (since it processes wafers individually rather than collectively), selective etching is carried out by dispensing a chemical solution ($CH_3COOH/H_2O_2/HF$ mixture) directly over the surface of the wafer via a dispensing nozzle which is displaced from the center of the wafer over a radius of ±40% of the total radius while the wafer rotates, which causes non-uniform etching: the central portion of the wafer is more deeply etched than the edge (a phenomenon which is characterized by the term "edge-slow" for that type of etching).

In the same manner, polishing carried out prior to selective etching, for example by chemical-mechanical polishing (CMP) tends to etch the center more than the edges of the-wafers, as shown in FIGS. 1 and 2 which show the surface quality of an SiGe wafer after polishing and selective etching. In FIG. 1, the layer of SiGe 1 already has a "dish" shaped surface ($S_{AP}$) after polishing alone, which is accentuated following selective etching ($S_{AG}$). FIG. 2 shows the over etching which results at the center of the SiGe layer compared with the edges thereof.

When the wafer comprises a layer of strained silicon sSi beneath the superficial SiGe layer, the lack of etching uniformity (carried out directly or after polishing) causes over etching of the sSi layer located beneath the SiGe layer at the center of the wafer while SiGe residues remain at the edge of the wafer. Thus, it will be understood that concatenations of CMP and selective etching steps or selective etching alone cannot directly result in sufficient uniformity of thickness and roughness of the denuded sSi layer. This lack of uniformity is particularly noticeable with large diameter wafers such as 300 millimeter (mm) diameter wafers, for example.

SUMMARY

The invention aims to overcome the disadvantages discussed above and proposes a solution which can compensate for wafer edge effects due to edge-slow type etching while limiting over etching at the center of the wafers to obtain uniform etching of the SiGe layer.

This aim is achieved by a method of wet chemical etching of wafers comprising at least one surface layer of silicon-germanium (SiGe) for etching by dispensing an etching solution deposited on a rotating wafer, the method being characterized in that it comprises a first etching step in which said etching solution is dispensed from a fixed position located at a predetermined distance from the center of the wafer, and a second etching step in which the etching solution is dispensed radially from the center of the wafer and over a maximum distance which is less than the radius of said wafer.

Thus, by employing an additional etching step in which the etching solution is dispensed from a fixed position at a predetermined distance from the center of the wafer, the method of the invention can remove the edge-slow type etching effect by compensating for its weak etching effect at the edge of the wafer. This not only produces uniform chemical etching of the SiGe layer, but also can preserve a hydrophilic surface across the whole wafer and can thus avoid the formation of studs in the center of the wafer such as, for example, in the case of a layer of SiGe (hydrophilic) on a layer of sSi (hydrophobic).

In the illustrative case of a wafer comprising a layer of strained silicon beneath the SiGe layer, in the first etching step, the etching solution may be dispensed from a fixed position located at about 50% of the radius of the wafer and in the second etching step, the etching solution may be dispensed over a maximum distance corresponding to about 40% of the wafer radius.

The etching times for the first and second etching step are determined as a function of:
 the thickness of the initial SiGe to be etched;
 the thickness at the edge compared with the thickness at the center of the wafer to be etched by the first etching step;
 the thickness at the center compared with the thickness at the edges of the wafer to be etched by the second etching step.

The rotation rate of the wafer may be in the range from 400 revolutions per minute (rpm) to 2000 rpm, preferably 1000 rpm.

DETAILED DESCRIPTION OF PREFERRED EMBODIMENTS

The etching method of the present invention is applicable in general to etching a layer of silicon-germanium (SiGe). Said etching method may be used to etch the SiGe layer:
 either completely to uncover a lower layer as uniformly as possible, such as a layer of strained silicon during fabrication of an SSOI type structure; this is known as selective etching;
 or partially, to reduce the surface roughness of the SiGe layer, for example.

Figure 1:
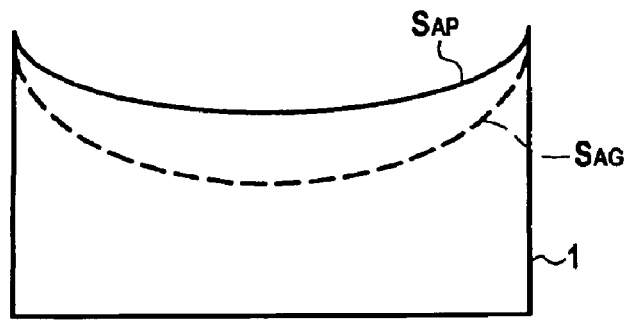
FIGS. 1 and 2, described above, are respectively a sectional and perspective view of a layer of silicon-germanium after selective etching.
Figure 2:
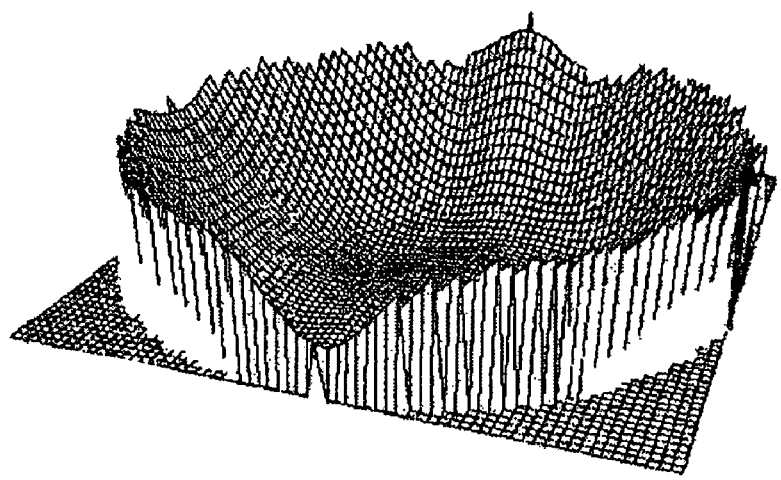
Figure 3:
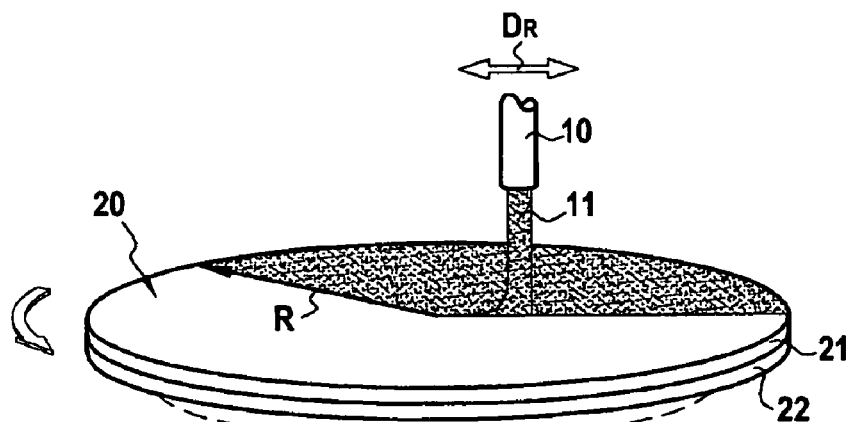
FIG. 3 is a diagrammatic perspective view showing a selective etching step by dispensing an etching solution onto a rotating wafer in accordance with one implementation of the invention.

FIG. 3 is a highly diagrammatic view of an implementation of the etching method of the invention applied to selective etching of a layer of SiGe as regards a layer of strained silicon. In accordance with the invention, single wafer type equipment is used, wherein selective etching is carried out by directly dispensing an etching solution 11 onto a single wafer 20 with radius R comprising a surface layer 21 of SiGe over a layer of strained silicon 22, the solution being dispensed via a nozzle 10 onto the rotating wafer 20. The nozzle 10 is connected to a mechanism (not shown) which can displace the nozzle above the wafer 20 in a radial direction $D_R$. The etching solution 11 is, for example, constituted by a known mixture of acetic acid ($CH_3COOH$), hydrogen peroxide ($H_2O_2$) and hydrofluoric acid (HF).

The aim of the etching method of the invention is to compensate for edge-slow type etching by adding a complementary edge-fast type etching step which can correct for the small degree of etching at the wafer edge and which can minimize over etching which occurs at the wafer center.

To optimize the parameters for edge-fast type etching, tests were carried out pertaining to the position of the nozzle dispensing the chemical attack solution. These tests were carried out for selective etching of an SiGe layer located over an active strained silicon layer, as shown in FIG. 3.

Figure 4:
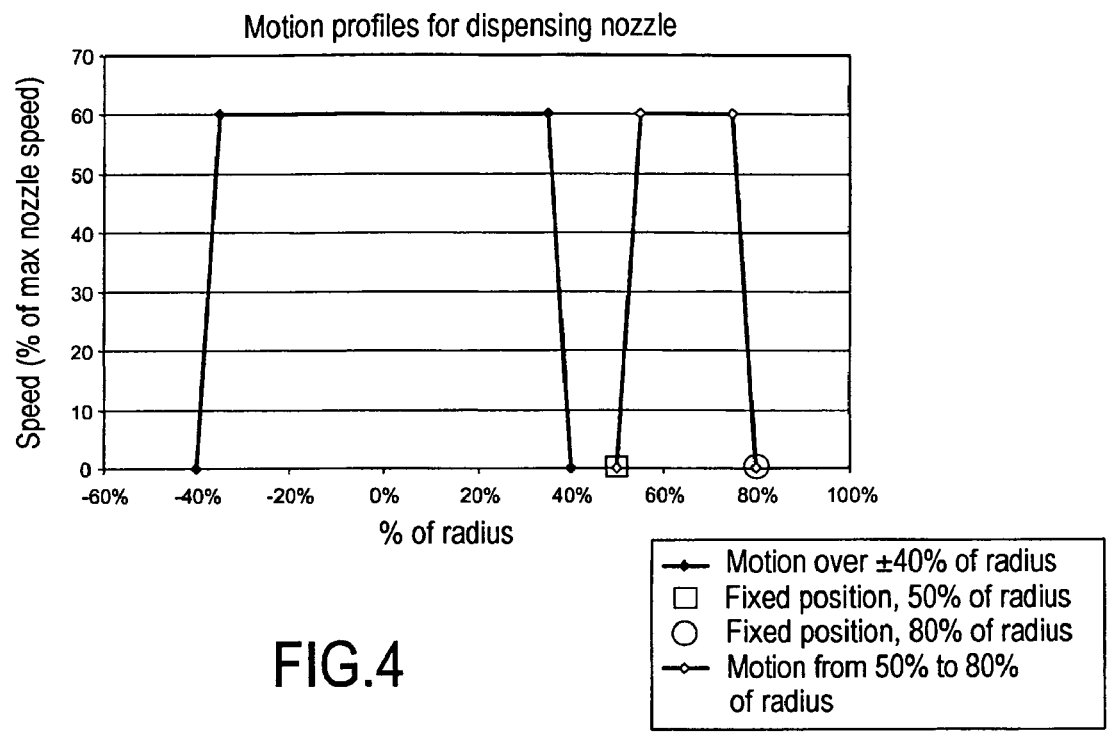
FIG. 4 shows the various movements and positions of an etching solution dispensing nozzle.

FIG. 4 shows the profiles for the motion of the etching solution dispensing nozzle placed vertically above the wafer (FIG. 3) in two position types: either with a fixed position or with motion of the nozzle along a radial direction with respect to the wafer, the nozzle having an oscillatory motion with respect to the center of the wafer so that it can be displaced from one side and the other of the center of the wafer over an equivalent distance. The speed shown on the figure corresponds to the percentage of the maximum radial displacement speed of the nozzle, which in this case is 130 millimeters per second (mm/s).

In the fixed position, the nozzle is positioned either at 50% of the radius of the wafer from the center, or at 80%.

In motion, the nozzle has been centered either at the middle of the wafer with a movement amplitude of ±40% of the radius, or at 65% of the radius of the wafer from the center, with a movement amplitude of ±15% corresponding to a displacement between 50% and 80% of the radius of the wafer.

The results obtained after selective etching when the motion of the arm is not centered on the wafer shows that the final strained silicon layer at the center of the wafer is etched less than the edges, and thus exhibits a raised central portion (also referred to herein as a "stud") of strained silicon. With non-centered positioning or motion of the dispensing nozzle over the wafer, the etching solution distributed by the nozzle no longer reaches the center of the wafer when the strained silicon layer is denuded since its hydrophobic nature prevents dispersion of the etching solution to the center of the wafer. As a result, in the case of selective etching of a layer of SiGe to denude a layer of strained silicon or any other hydrophobic layer, the edge-fast type etching step is carried out before the edge-slow type etching step in which the motion of the dispensing nozzle is centered on the wafer.

Figure 5:
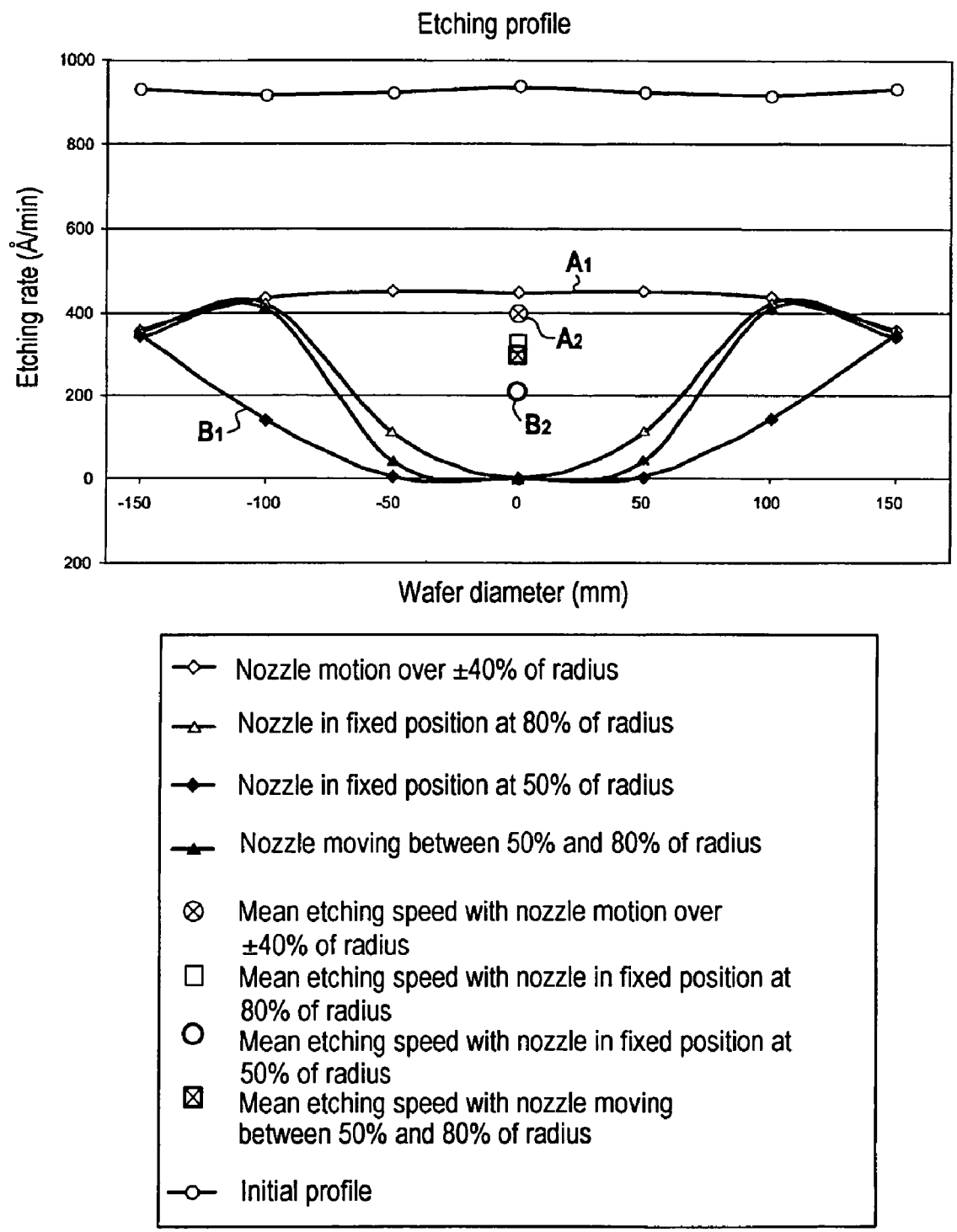
FIG. 5 shows etching profiles for a layer of SiGe as a function of the various displacements and/or positions of the dispensing nozzle.

The rates of etching the surfaces of SiGe-strained silicon wafers (wafer diameter 300 mm) were then determined as a function of the various positions of the distribution nozzle mentioned above. They are indicated in FIG. 5. The curve shown at the top of FIG. 5 corresponds to the initial profile of a wafer of SiGe-strained silicon after polishing but before selective etching.

An analysis of the results shown in FIG. 5 shows that when the nozzle is off-center, the thickness generally has a maximum (or a minimum) at an intermediate radius (or the thickness "undulates") in an unfavorable manner, except in the case in which the position is fixed at 50% of the radius whereby the variation is regular (monotonic) from the center to the edge; the opposite is true for the case in which the nozzle oscillates at ±40% of the radius around the center.

An analysis of the curves shows that for the other positions (i.e. a nozzle in a position fixed at 80% of the radius or moving between 50% and 80% of the radius) of the dispensing nozzle, bumps appear due to very rapid etching at the nozzle, i.e. at the edges, with very slow or even nonexistent etching at the center of the wafer.

These observations are used to define the basis of the etching method of the invention, namely an appropriate combination of edge-fast type etching (i.e. dispensing the etching solution from off-center positions on the wafer, encouraging edge etching of the wafer) with edge-slow type etching (i.e. dispensing the etching solution from the center of the wafer) to improve etching uniformity and in the case of selective etching of SiGe-strained silicon wafers, to carry out edge-fast type etching prior to edge-slow type etching to conserve a hydrophilic surface and not generate studs of strained silicon at the center of the wafer.

For the tests carried out above, i.e. for 300 mm diameter SiGe-strained silicon wafers, the single wafer type equipment (FIG. 3) must be configured to allow edge-fast type etching with a dispensing nozzle located in a position fixed at 50% of the wafer radius, said first etching step being followed by a second, edge-slow type etching step in which the nozzle is in radial motion above the wafer and is alternately displaced from each side to the center of the wafer over a distance of ±40% of the radius of the wafer.

Figure 6:
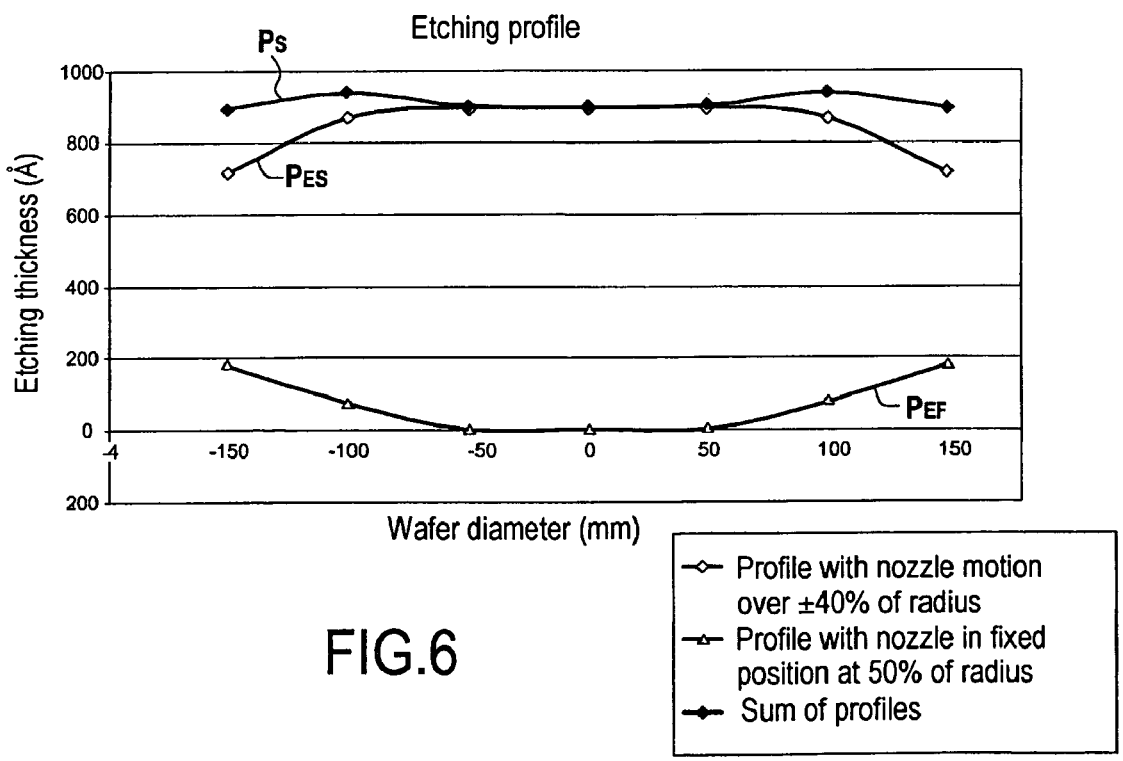
FIG. 6 shows the etching profile for a wafer after an etching step with the nozzle in a fixed position and after an etching step with the nozzle moving, as well as the resulting profile following said two steps.

FIG. 6 shows the etching profile of such a wafer following the edge-fast type etching step carried out from a fixed nozzle position located at 50% of the wafer radius (curve $P_{EF}$) and after the edge-slow type etching step with the nozzle moving from the center of the wafer over a distance of 40% of the radius of the wafer (curve $P_{ES}$) FIG. 6 also shows the resultant profile (curve $P_S$) of the wafer after the two etching steps (edge-fast etching being carried out in this case before edge-slow etching). It will be observed that this resultant profile is almost entirely complementary to the initial profile of the wafer shown in FIG. 5, which demonstrates that the method of the invention can not only produce uniform etching of the SiGe layer but can also correct initial defects in uniformity present on the surface of the SiGe layer.

The results obtained in FIG. 5 have allowed the position of the nozzle to be defined which can produce the edge-fast etching profile (curve $B_1$) which is most suited to compensating for the effects of edge-slow type etching (curve $A_1$).

However, as can be seen in this figure, the etching rates are different between these two etching types. These rates vary as a function of the region of the wafer under consideration and the mean value (points $A_2$ and $B_2$). As a result, a ratio must be established between the etching periods for each step (edge-fast and edge-slow) which can produce the desired compensation between these two steps.

The etching periods are also defined by taking the following parameters into account:
- the initial surface quality of the wafer after polishing, knowing that polishing is also of the edge-slow type, i.e. produces an over thickness at the periphery of the wafer;
- the thickness of the initial SiGe to be etched;
- the thickness of the edge with respect to the thickness at the center to be etched by edge-fast type etching;
- the thickness at the center with respect to the thickness of the edges to be etched by edge-slow type etching.

As an example, for an SiGe thickness to be etched of about 900 Å and for a wafer rotation rate of about 1000 rpm, 350 angstroms per minute (Å/min) are consumed at the edges by edge-fast type etching with the etching solution dispensing nozzle in a fixed position at 50% of the radius of the wafer, while 88 Å/min are consumed at the center of the wafer by edge-slow type etching, with the nozzle moving from the center of the wafer over a distance of 40% of the radius thereof.

A ratio of $35/8.8 \approx 4$ can thus be deduced for the respective etching periods between the two steps.

Thus, if the edge-slow etching step is 160 seconds (s) long, then the edge-fast type step will be 160/4=40 s.

Furthermore, if a polishing step is carried out, creating an over thickness at the edge of about 22 Å, the edge-fast etching step must be extended by about 10 s, giving a total time of 50 s for this step.

The advantages resulting from this novel method are: better quality of the strained silicon layer, namely as regards uniformity of thickness and surface roughness, and better reproducibility of the etching procedure.

Although the above examples have been described in relation to wafers comprising an SiGe layer covering a layer of strained silicon which has to be denuded by selective etching of the SiGe layer, the present invention is applicable in the same manner as that described above to a wafer having a layer of SiGe which is only to be partially etched. The method of the invention can readily be used for uniform etching of only a portion of the layer of SiGe with the aim, for example, of reducing its roughness.

The invention described and claimed herein is not to be limited in scope by the preferred embodiments herein disclosed, since these embodiments are intended as illustrations of several aspects of the invention. Any equivalent embodiments are intended to be within the scope of this invention. Indeed, various modifications of the invention in addition to those shown and described herein will become apparent to those skilled in the art from the foregoing description. Such modifications are also intended to fall within the scope of the appended claims.

A number of references are cited herein, the entire disclosures of which are incorporated herein, in their entirety, by reference for all purposes. Further, none of these references, regardless of how characterized above, is admitted as prior to the invention of the subject matter claimed herein.

What is claimed is:

1. A method of wet chemical etching of a rotating wafer comprising at least one surface layer of silicon-germanium (SiGe) which is to be etched, the method comprising:
    a first etching step in which an etching solution is dispensed onto said wafer from a fixed position located at a certain distance from the center of said wafer, and
    a second etching step in which said etching solution is dispensed onto said wafer while in motion along a radial path from a position varying from the center of said wafer to a maximum distance which is less than the certain distance of said wafer.

2. The etching method of claim 1 wherein the wafer comprises a layer of strained silicon beneath the layer of SiGe, and wherein, in the first etching step, said certain distance is located at about 50% of the length of the radius of said wafer, and wherein, in the second etching step, said maximum distance is about plus or minus 40% of the length of the radius of said wafer.

3. The method of claim 2 wherein the first etching step is conducted for a period that is about 4 times shorter than that conducted for the second etching step.

4. A method of wet chemical etching of a rotating wafer comprising at least one surface layer of silicon-germanium (SiGe) which is to be etched, the method comprising:
    a first etching step in which an etching solution is dispensed onto said wafer from a fixed position located at a certain distance from the center of said wafer;
    a second etching step in which said etching solution is dispensed onto said wafer while in motion along a radial path from a position varying from the center of said wafer to a maximum distance which is less than the certain distance of said wafer; and
    chemical-mechanical polishing of the SiGe surface layer carried out prior to said first and second etching steps, and wherein the first etching step conducted for a period that is shorter than that conducted for the second etching step.

5. The method of claim 1 wherein the etching period for the first etching step and the etching period for the second etching step are determined as a function of:
    the initial thickness of SiGe to be etched;
    the thickness at the edge compared with the thickness at the center of the wafer to be etched by the first etching step; and
    the thickness at the center compared with the thickness at the edge of the wafer to be etched by the second etching step.

6. The method of claim 1 wherein the diameter of said wafer is 300 mm.

7. The method of claim 1 wherein said etching solution comprises a mixture of acetic acid (CH3COOH), hydrogen peroxide (H2O2) and hydrofluoric acid (HF).

8. The method of claim 1 wherein the wafer is rotated at 400 rpm to 2000 rpm.

9. A method of wet chemical etching of a rotating wafer comprising:
    a first dispensing step for dispensing etching solution from a fixed position onto said wafer away from the center of said wafer so that etching occurs preferentially at the edge of said wafer; and
    a second dispensing step for dispensing etching solution from a moving position onto said wafer near the center of said wafer so that etching occurs preferentially at the center of said wafer;
    wherein the first and second dispensing steps are conducted so that etching is substantially uniform across the entire wafer.

10. The method of claim 9 wherein said first dispensing step comprises dispensing said etching solution from a fixed off-center position near the edge of said wafer.

11. The method of claim 9 wherein said second dispensing step comprises dispensing said etching solution from a central positions on the wafer.

12. The method of claim 11 wherein said dispensing to etch preferentially at the center of said wafer comprises dispensing from a moving position varying from the center to a maximum radial distance which is less than the radius of said wafer.

13. The method of claim 9 wherein said wafer comprises a surface layer of SiGe which is to be etched, and wherein said first dispensing step is performed before said second dispensing step.

14. The method of claim 9 wherein the period for the first dispensing step and the period for the second dispensing step are determined as a function of:

the surface thickness of said wafer to be etched;

the thickness at the edge compared with the thickness at the center of the wafer to be etched by the first etching step; and the thickness at the center compared with the thickness at the edge of the wafer to be etched by the second etching step.

15. The method of claim 4, wherein the first etching step is conducted for a period that is about 3.2 times shorter than that conducted for the second etching step.

* * * * *